United States Patent
Ooi et al.

(10) Patent No.: US 6,617,188 B2
(45) Date of Patent: Sep. 9, 2003

(54) QUANTUM WELL INTERMIXING

(75) Inventors: Boon Siew Ooi, Penang (MY); Yee Loy Lam, Singapore (SG); Yuen Chuen Chan, Singapore (SG); Yan Zhou, Singapore (SG); Siu Chung Tam, Singapore (SG)

(73) Assignee: NTU Ventures PTE Ltd, Singapore (SG)

( * ) Notice: Subject to any disclaimer, the term of this patent is extended or adjusted under 35 U.S.C. 154(b) by 0 days.

(21) Appl. No.: 09/802,071

(22) Filed: Mar. 8, 2001

(65) Prior Publication Data

US 2002/0003918 A1 Jan. 10, 2002

(30) Foreign Application Priority Data

| Mar. 8, 2000 | (WO) | PCT/SG00/00038 |
| Mar. 8, 2000 | (WO) | PCT/SG00/00039 |
| Sep. 11, 2000 | (SG) | 2000 04786 |
| Sep. 11, 2000 | (SG) | 2000 04787 |

(51) Int. Cl.$^7$ .............................................. H01L 21/00
(52) U.S. Cl. .............................. 438/36; 438/37; 438/46; 430/321
(58) Field of Search .............................. 438/21, 22, 24, 438/36, 37, 45, 46, 47; 372/45, 46; 430/321, 394, 396

(56) References Cited

U.S. PATENT DOCUMENTS

| 5,745,617 A | * | 4/1998 | Starodubov et al. | 385/37 |
| RE36,352 E | * | 10/1999 | Swanson et al. | 359/565 |
| 6,027,989 A | * | 2/2000 | Poole et al. | 438/522 |
| 6,071,652 A | * | 6/2000 | Feldman et al. | 430/7 |
| 6,309,809 B1 | * | 10/2001 | Starikov et al. | 430/395 |
| 2002/0018964 A1 | * | 2/2002 | Jerominek | 430/313 |
| 2002/0019305 A1 | * | 2/2002 | Wu | 501/56 |

OTHER PUBLICATIONS

Polarization insensitive InGaAs/InGaAsP/InP amplifiers using quantum well intermixing, XP 000626052, J–J. He et al., Appl. Phys. Lett., vol. 69, No. 4, July 1996, p. 562–564.

* cited by examiner

*Primary Examiner*—Savitri Mulpuri
(74) *Attorney, Agent, or Firm*—Perman & Green, LLP

(57) ABSTRACT

The present invention provides a novel technique based on gray scale mask patterning (110), which requires only a single lithography and etching step (110, 120) to produce different thickness of SiO$_2$ implantation mask (13) in selected regions followed by a one step IID (130) to achieve selective area intermixing. This novel, low cost, and simple technique can be applied for the fabrication of PICs in general, and WDM sources in particular. By applying a gray scale mask technique in IID in accordance with the present invention, the bandgap energy of a QW material can be tuned to different degrees across a wafer (14). This enables not only the integration of monolithic multiple-wavelength lasers but further extends to integrate with modulators and couplers on a single chip. This technique can also be applied to ease the fabrication and design process of superluminescent diodes (SLDs) by expanding the gain spectrum to a maximum after epitaxial growth.

14 Claims, 12 Drawing Sheets

QUANTUM WELL INTERMIXING

BACKGROUND TO THE INVENTION

The monolithic integration of several optoelectronics devices in optoelectronics integrated circuits (OEICs) and photonic integrated circuits (PICs) is of considerable interest for the development of telecommunications systems.

In OEICs, optical devices such as lasers and electronic devices such as transistors are integrated on a single chip for high speed operation since parasitic reactance in the electrical connections can be minimized from the closely packed devices.

PICs are a subset of OEICs with no electrical components, in which only photons are involved in the communication or connection between optoelectronics and/or photonic devices. The driving forces for PICs are to improve the complexity of next-generation optical communication links, networking architectures and switching systems, such as in multiple channel wavelength division multiplexing (WDM) and high speed time division multiplexing (TDM) systems. In PICs, besides gaining from the low cost, size reduction, and increased packaging robustness, the main advantage is that all the interconnections between the individual guided-wave optoelectronics devices are precisely and permanently aligned with respect to one another since the waveguides are lithographically produced.

In the integration process, complex devices are built up from components that are very different in functionality such as light emitters, waveguides, modulators and detectors. Each component needs different material structures to achieve optimized performance. As a result, the ability to modify the bandgap energy and the refractive index of materials is important in order to realize OEICs and PICs. A number of techniques have emerged for this purpose, including growth and regrowth, selective area epitaxy or growth on a patterned substrate and quantum well intermixing (QWI).

Growth and regrowth is a complicated and expensive technique which involves growing, etching and regrowing of quantum well (QW) layers at selected areas on bulk material. These layer structures are overgrown with the same upper cladding but a different active region. This approach suffers from mismatches in the optical propagation coefficient and mismatches in the dimensions of the waveguide at the regrown interface. In addition, this process gives low yield and low throughput, and therefore adds cost to the final product.

Selective area growth utilizes differences in epitaxial layer composition and thickness produced by growth through a mask to achieve spatially selective bandgap variation. Prior to epitaxy growth, the substrate is patterned with a dielectric mask such as $SiO_2$, in which slots with different widths are defined. The growth rate in the open areas depends on the width of the opening and the patterning of the mask. No growth can take place on top of the dielectric cap. However, surface migration of the species can take place for some distance across the mask to the nearest opening. The advantage of this approach is a reduction in the total number of processing steps such that essentially optimum laser and modulator multiple quantum well (MQW) sections can be accomplished in a single epitaxial growth stage. This process works well under a precisely controlled set of parameters but is difficult to manipulate in a generic fashion. In addition, this technique gives poor spatial resolution of around 100 $\mu$m, and hence the passive section generally has a relatively high loss.

QWI is based on the fact that a QW is an inherently metastable system due to the large concentration gradient of atomic species across the QWs and barriers interface. Hence, this allows the modification of the bandgap of QW structures in selected regions by intermixing the QWs with the barriers to form alloy semiconductors. This technique offers an effective post-growth method for the lateral integration of different bandgaps, refractive index and optical absorption within the same epitaxial layers.

The QWI technique has been gaining recognition and popularity for which several potential applications in integrated optoelectronics have been identified, for example bandgap-tuned electroabsorption modulators, bandgap-tuned lasers, low-loss waveguides for interconnecting components on an OEIC or PIC, integrated extended cavities for line-narrowed lasers, single-frequency distributed Bragg reflector (DBR) lasers, mode-locked lasers, non-absorbing mirrors, gain or phase gratings for distributed feedback (DFB) lasers, superluminescent diodes, polarization insensitive QW modulators and amplifiers, and multiple wavelength lasers.

Current research has been focused on QWI using approaches such as impurity free vacancy induced disordering (IFVD), laser induced disordering (LID) and impurity induced disordering (IID). Each of these QWI techniques has its advantages and shortcomings.

The IFVD method involves the deposition of a dielectric capping material on the QW materials and subsequent high temperature annealing to promote the generation of vacancies from the dielectric cap to the QW materials and hence enhance the intermixing at selected areas. For instance, in GaAs-AlGaAs QW materials, $SiO_2$ is known to induce out-diffusion of Ga atoms during annealing, hence generating group III vacancies in the QW material. The thermal stress at the interface between the GaAs and the $SiO_2$ layer plays an important role. The thermal expansion coefficient of GaAs is ten times larger than that of $SiO_2$. During high temperature annealing, the bonding in the highly porous $SiO_2$ layer deposited using plasma-enhanced chemical vapor deposition (PECVD) may be broken due to the stress gradient between the GaAs and $SiO_2$ film. Thus, the out-diffusion of Ga helps to relieve the tensile stress in the GaAs. These Ga vacancies then propagate down to the QW and enhance the interdiffusion rate of Ga and Al, and hence result in QWI. After the intermixing process, the bandgap in the QW material widens and the refractive index decreases.

The selectivity of this technique can be obtained using an $SrF_2$ layer to inhibit the outdiffusion of Ga, hence suppress the QWI process. Using this technique, devices such as multiple wavelength bandgap tuned lasers and multiple channel waveguide photodetectors have been successfully demonstrated.

Although IFVD is a successful technique when employed in GaAs/AlGaAs system, this technique gives poor reproducibility in InGaAs/InGaAsP systems. Furthermore, due to the poor thermal stability of InGaAs/InGaAsP materials, the IFVD process, which requires high temperature annealing, is found to give low bandgap selectivity in InGaAs/InGaAsP based QW structures.

Laser induced disordering (LID) is a promising QWI process to achieve disordering in InGaAs/InGaAsP QW materials due to the poor thermal stability of the materials. In the photoabsorption-induced disordering (PAID) method, a continuous wave (CW) laser irradiation is absorbed in the QW regions, thereby generating heat and causing thermal induced intermixing. Although the resulting material is of high optical and electrical quality, the spatial selectivity of this technique is limited by lateral flow to around 100 µm. A modification of the PAID method, known as pulsed-PAID (P-PAID), uses high-energy Q-switched Nd:YAG laser pulses to irradiate the InP-based material. Absorption of the pulses results in disruption to the lattice and an increase in the density of point defects. These point defects subsequently interdiffuse into the QW during high temperature annealing and hence enhance the QW intermixing rate. Though P-PAID can provide spatial resolution higher than 1.25 µm and direct writing capability, the intermixed materials give low quality due to the formation of extended defects.

Of all the QWI methods, impurity induced disordering (IID) is the only process which requires the introduction of impurities into the QW materials in order to realize the intermixing process. These impurities can be introduced through focused ion beam, furnace-based impurity diffusion and also ion implantation.

IID is a relatively simple and highly reproducible intermixing process. It has the ability to provide high spatial resolution for the integration of small dimension devices and bandgap shifts can be controlled through the implantation parameters. This technique is commonly used to achieve lateral electrical and optical confinement in semiconductors such that low threshold current and single lateral-mode operation can be obtained. Furthermore, the IID process is of considerable interest for the integration of WDM systems, such as multiple wavelength laser sources, low-loss waveguides, modulators and even detectors.

The IID effect is widely accepted to consist of two stages. The first stage is to implant impurities into the QW material. The subsequent stage is to anneal the material to induce diffusion of both impurity and point defects into the QWs and barriers, and hence interdiffusion of matrix elements between QWs and barriers. In an InGaAs/InGaAsP QW system, the interdiffusion of Group V elements from barrier to well, which results in blueshifting of the bandgap energy, is believed to be caused by the diffusion of point defects generated during the implantation process, the self-interdiffusion at elevated temperature (thermal shift), and the diffusion of the implanted species.

During implantation, impurities as well as point defects, such as Group III vacancies and interstitials, are introduced into the material in selected areas. The diffusion of these point defects and impurities at elevated temperature enhances the interdiffusion rate between the QWs and barriers and hence promotes intermixing after annealing. Under the influence of injected impurities, the compositional profile of the QW is altered from a square to a parabolic-like profile. As a result, after the interdiffusion process, the local bandgap increases and the corresponding refractive index decreases.

Using the IID technique, selective area intermixing across a wafer can be obtained by using an $SiO_2$ implant mask with various thicknesses. However, this technique involves multiple lithography and etching steps which complicate the fabrication process.

The ability to control the bandgap across a III–V semiconductor wafer is a key requirement for the fabrication of monolithic photonic integrated circuits (PICs). The absorption band edge of QW structures needs to be controlled spatially across a wafer to allow the fabrication of integrated lasers, modulators, and low-loss waveguides. Although QWI techniques offer great advantages over growth and regrowth and selective epitaxial growth techniques for the bandgap engineering process, the spatial control of conventional QWI techniques is indirect and complicated.

The explosive growth of Internet traffic, multimedia services and high-speed data services has exerted pressure on telecommunications carriers to expand the capacity of their networks quickly and cost effectively. Carriers normally have three options to expand capacity, ie install new fibers, increase the bit rate of the transmission system, or employ wavelength division multiplexing (WDM). While the first option has problems of high cost and right-of-way and the second option has limited growth potential because of inherent system limitations, the third option is therefore very attractive because it is capable of manifold increase of the network capacity at a modest cost.

SUMMARY OF THE INVENTION

According to the present invention, a method of manufacturing a photonic integrated circuit comprising a structure having a quantum well region, includes the step of performing quantum well intermixing on the structure, wherein the step of performing quantum well intermixing comprises the steps of forming a photoresist on the structure and differentially exposing regions of the photoresist in a spatially selective manner in dependence on the degree of quantum well intermixing required, and subsequently developing the photoresist.

Preferably, the method comprises the step of applying an optical mask to the photoresist and exposing the photoresist through the optical mask, the optical mask having an optical transmittance that varies in a spatially selective manner. In the preferred example, the optical mask is a Gray scale mask.

Preferably, the optical transmittance of the optical mask varies according to a predetermined function. This function is usually dependent on the degree of intermixing required. In the preferred example, the optical transmittance is substantially continuously variable over at least a portion of the mask.

Preferably, the photoresist is applied to a masking layer. Preferably, the masking layer is a dielectric.

Preferably, the method further comprises the step of etching the structure with the developed photoresist in situ to provide a differentially etched masking layer.

In one example, the method further comprises the step of introducing impurities into the structure in a single ion implantation step. Alternative forms of IID include focused ion beam and furnace-based impurity diffusion.

Preferably, the impurities are implanted in a region remote from the quantum well structure.

In another example, the method further comprises the step of exposing the structure to a plasma or other source of high energy radiation, thereby to introduce defects in the structure to promote subsequent quantum well intermixing. The key feature of the process is the use of a radiation source to cause radiation damage to a crystalline structure. To achieve this, a well defined minimum energy transfer is needed. This is called the displacement energy, $E_D$. Energy transfers exceeding $E_D$ will cause atom displacement, either primary displacement, when a host ion is struck by one of the instant particles, or secondary displacement, when energy transfer is from the host atom previously struck. Preferably, the plasma is generated by electron cyclotron resonance. This plasma induced QWI process is described in detail in our co-pending International patent application No. _____ (Agent's reference PJF01076WO).

Preferably, the method further comprises the step of annealing the structure.

For the preferred examples, the present invention provides a novel technique based on gray scale mask patterning, which requires only a single lithography and etching step to produce different thicknesses of $SiO_2$ implantation mask in selected regions followed by a one-step IID to achieve selective area intermixing. This novel, low cost, and simple technique can be applied for the fabrication of PICs in general, and WDM sources in particular. By applying a gray scale mask technique in IID in accordance with the present invention, the bandgap energy of a QW material can be tuned to different degrees across a wafer. This enables not only the integration of monolithic multiple-wavelength lasers but further extends to integrate with modulators and couplers on a single chip. This technique can also be applied to ease the fabrication and design process of superluminescent diodes (SLDs) by expanding the gain spectrum to a maximum after epitaxial growth.

The photonic integration research community currently views QWI technology as a promising approach only for two-section photonic devices as conventional QWI processes would otherwise become tedious and complicated. Although it is complex and not cost effective, researchers have instead preferred to use selective area epitaxy for multiple-section integration. The present invention demonstrates that the application of QWI is not limited to two sectional devices. In addition, the technique is more cost effective, and offers a higher throughput and higher yield compared to selective area epitaxy. The combination of using a gray scale mask technique and an IID process to spatially control QWI across a wafer is therefore expected to create a significant impact.

BRIEF DESCRIPTION OF THE DRAWINGS

Examples of the present invention will now be described in detail with reference to the accompanying drawings, in which.

DETAILED DESCRIPTION

Figure 1:
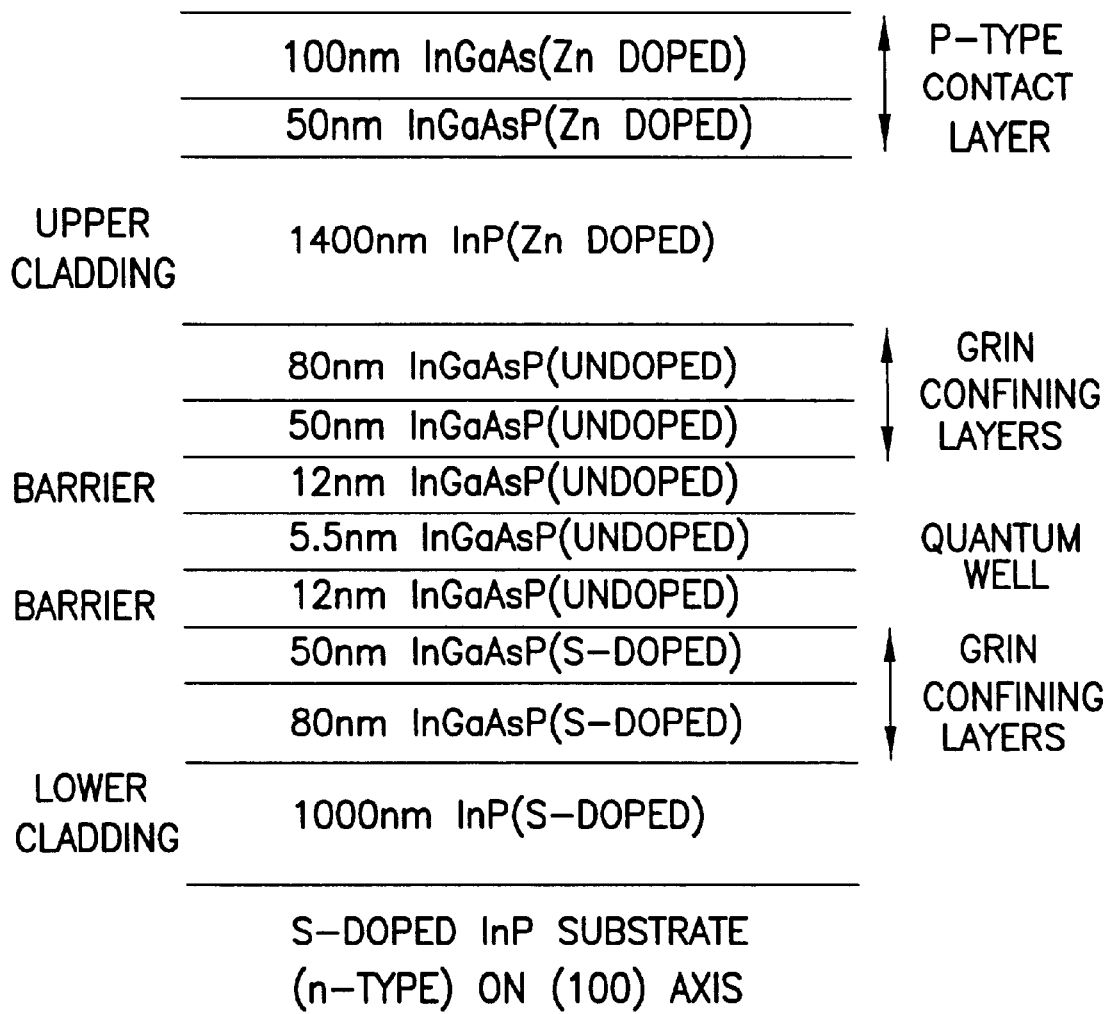
FIG. 1 is a schematic representation of an InGaAs/InGaAsP SQW layer structure.
Figure 2:
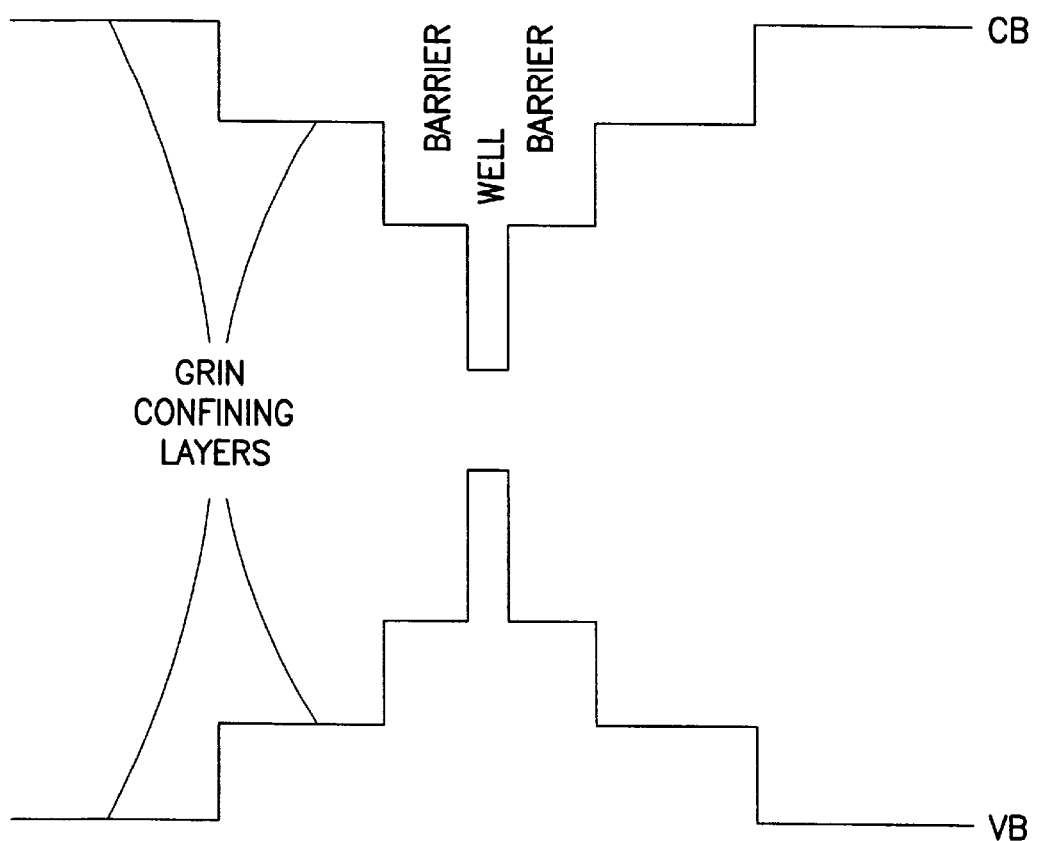
FIG. 2 is a band diagram for the structure of FIG. 1.

The lattice-matched InGaAs/InGaAsP single quantum well materials used in the fabrication of the devices described below, were grown by metal-organic vapor phase epitaxy (MOVPE) on a (100)-orientated n+-type S-doped InP substances with an etch pit density of less than 1000 $cm^{-2}$. A schematic diagram of the layer structure and the corresponding band diagram are shown in FIGS. 1 and 2, respectively. The InGaAs/InGaAsP laser structure consists of a 55 Å single $In_{0.53}Ga_{0.47}As$ well with 120 Å InGaAsP barriers ($\lambda_g$=1.26 μm, where $\lambda_g$ is the wavelength corresponding to the bandgap). The active region was bound by a stepped graded index (GRIN) waveguide core consisting of InGaAsP confining layers. The thickness and compositions of these layers (from the QW's barrier outward) were 500 Å ($\lambda_g$=1.18 μm) and 800 Å ($\lambda_g$=1.05 μm). The structure was completed by InP lower cladding of 1 μm (with S-doping to $2.5 \times 10^{18}$ $cm^{-3}$) and upper cladding of 1.4 μm (with Zn-doped of $5 \times 10^{17}$ $cm^{-3}$). The contact layers consist of 500 Å InGaAsP (Zn-doped of $2 \times 10^{18}$ $cm^{-3}$) and 1000 Å InGaAs (Zn-doped of $2 \times 10^{19}$ $cm^{-3}$). The waveguide core was undoped, thus forming a PIN structure with an intrinsic region restricted to the QW and the GRIN layers. The samples gave a PL wavelength peak at 1.54±0.02 μm at room temperature.

Examples of impurities that may be used for the subsequent IID QWI process can be classified into electrically active species such as Zn (p-type dopant) and Si (n-type dopant), and electrically neutral species such as B, F, As and P.

Two major issues have been identified for using an IID process in photonic integration. The first issue is that a typical impurity concentration of $10^{18}$ $cm^{-3}$ is usually used to enhance QW intermixing. Most of the electrically active impurities are shallow impurities which ionize at room temperature and contribute to high free carrier absorption. The other issue is that the residual damage will degrade the quality of the material and directly influence the efficiency and lifetime of the devices.

To overcome the first issue a neutral impurity, in this case P, is used in the examples as this species is one of the fundamental elements of an InGaAs/InGaAsP laser system. As compared to the electrically active impurities, neutral impurities such as P and As should ideally contribute to insignificant free carrier absorption loss.

The other issue on residual damage can be minimized or eliminated by optimizing the implantation and annealing conditions. In the present invention, an implant energy as low as 360 keV was chosen so that only minimum or no extended defects are introduced after QWI. At low energy implantation, the process can be controlled such that the bombardment only occurs in the top contact layer. As a result, the crystalline quality of the cladding layers and QWs can be preserved. In addition, a relatively low implant dose, ie below $1 \times 10^{14}$ $ions/cm^2$, is used to prevent the formation of amorphous layers during ion implantation so that high surface quality can be obtained after QWI.

The samples were first implanted at 200° C. with doses varying between $1 \times 10^{12}$ $ions/cm^2$ and $1 \times 10^{14}$ $ions/cm^2$ using doubly charged ions at an implantation energy of 360 keV. The samples were tilted 7° from the ion beam during implantation in order to reduce channeling effects.

Subsequent annealing of the samples was carried out using a rapid thermal processor (RTP) under nitrogen-riched environment. During annealing, the samples were face down onto a clean polished GaAs substrate and another GaAs cap was placed on top of the sample. These two GaAs substrates serve as proximity caps to prevent As out-diffusion during annealing. The annealing process not only promotes QW intermixing but also recrystallizes the implanted layers to a large extent.

Figure 3:
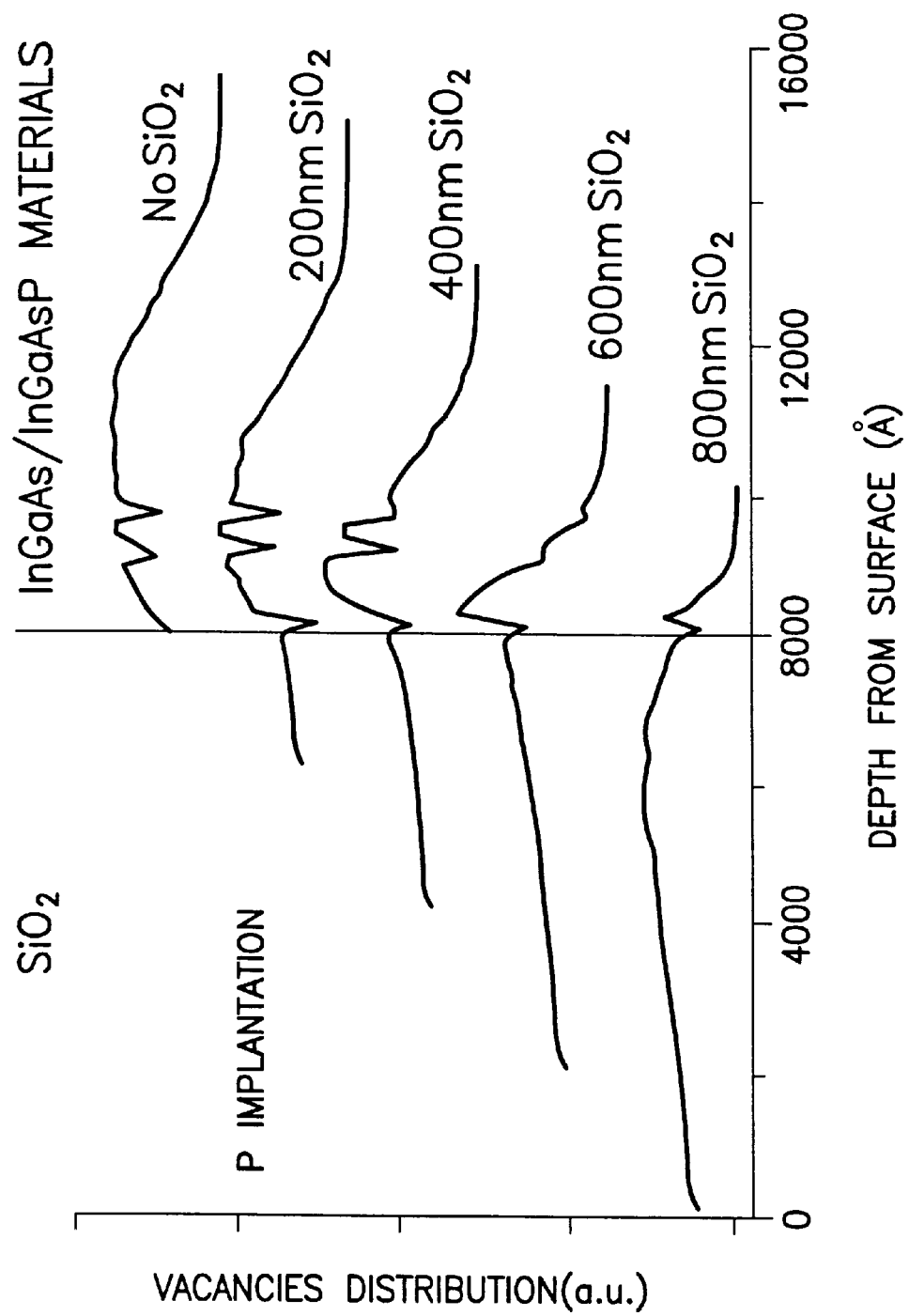
FIG. 3 is a graph showing the results of a Transport of Ions in Matter (TRIM) vacancy simulation using different thicknesses of $SiO_2$ implantation mask.

FIG. 3 shows the simulated vacancy distribution profiles in the SiO$_2$/InGaAs-InGaAsP after implantation with P at 360 keV. Different degrees of QWI can be obtained by introducing different concentration of impurities into materials. FIG. 3 implies that selective intermixing in selected areas can be obtained if an SiO$_2$ implant mask with variable thickness can be created across a wafer. The conventional technique for fabricating multiple wavelength lasers involves multiple lithography and etching steps. This is achieved in the present invention using a gray scale mask technique. As will be described in detail below, this novel gray scale mask technique offers a simple, highly reproducible, and more efficient method since it requires only a single lithography and a single dry etching step to create multiple thicknesses of SiO$_2$ implantation mask across the wafer.

Figure 4:
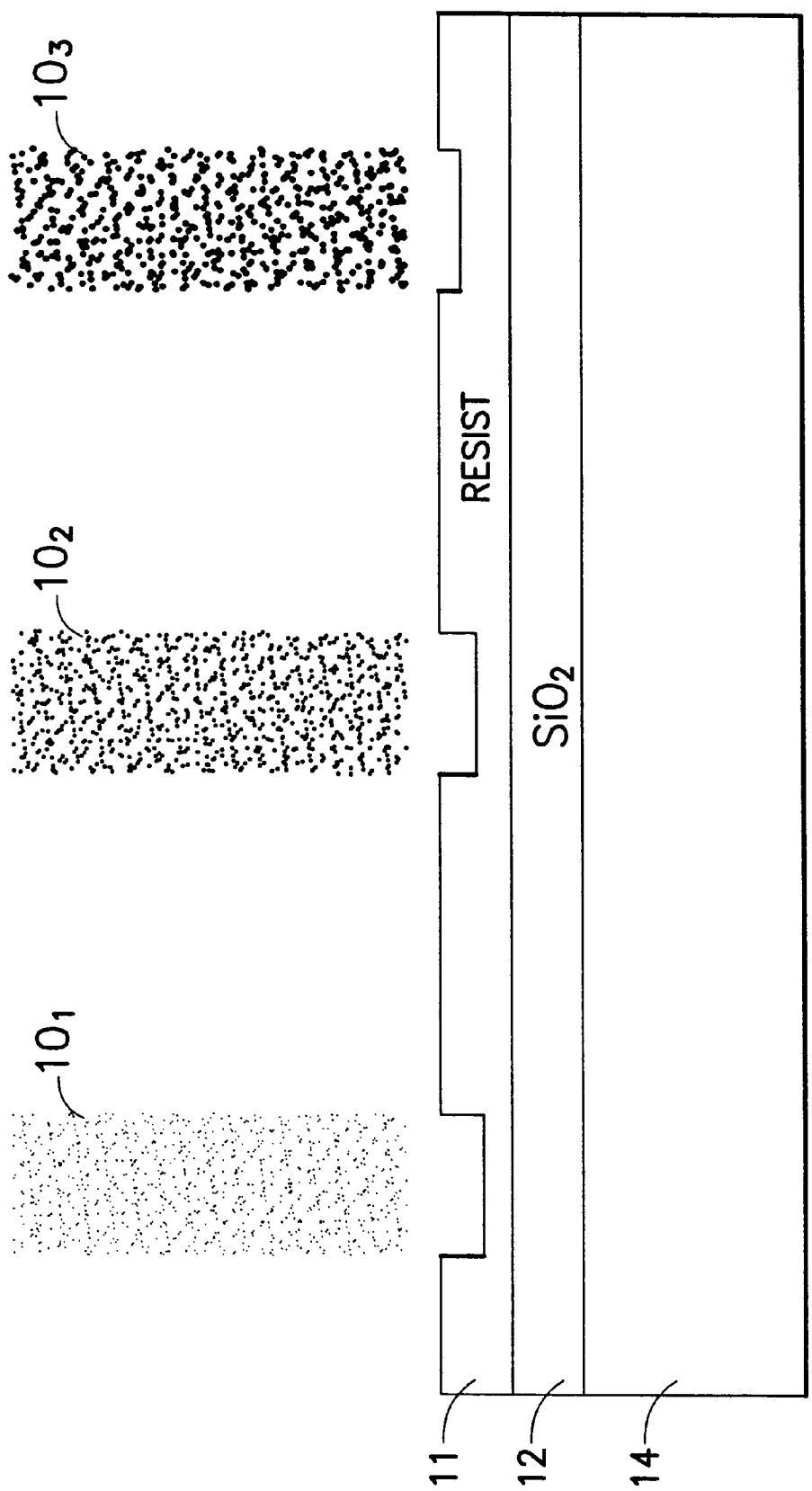
FIG. 4 illustrates gray mask lithography patterning of a layer of photoresist.
Figure 5:
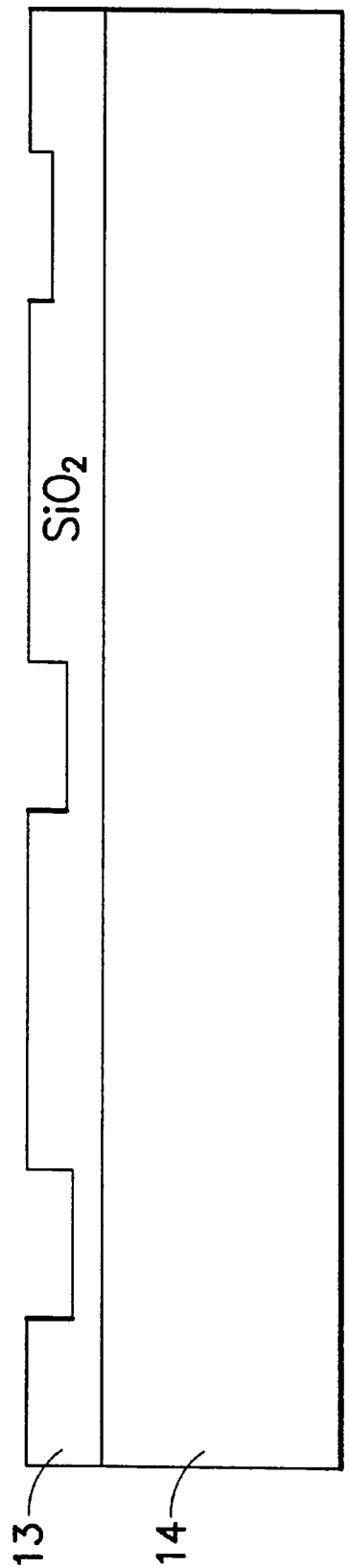
FIG. 5 illustrates a Reactive-Ion Etching (RIE) process.
Figure 10:
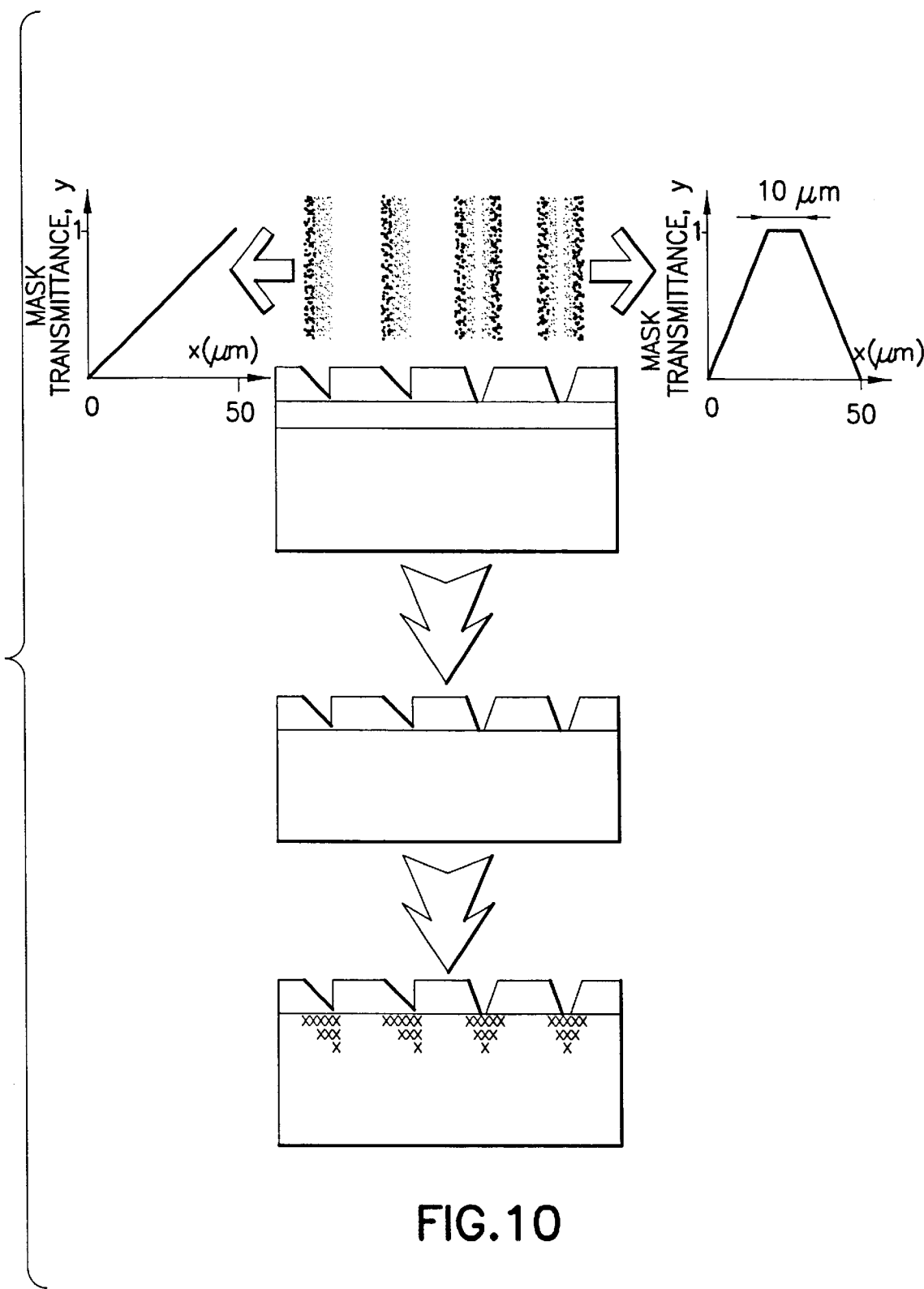
FIG. 10 is a flow diagram illustrating the fabrication of an SLD device.

As shown in FIGS. 4 and 5, the gray scale mask technique makes use of different transparency of areas of a gray scale mask 10 to control the degree of the exposure of photoresist 11 in selected regions and thus different thickness of photoresist after development. The degree of the development of photoresist 11, ie the depth of the remaining photoresist, after the UV exposure has a linear relationship with the optical density. In this example, the gray scale mask 10 was designed to have 10 different levels for multiple wavelength lasers, ie from 0.15 to 1.05 with a step of 0.1 of optical density (OD). This is shown in Table 1 below. The stripes are of 50 μm width with 350 μm spacing. Therefore it is expected to obtain 10 different bandgaps across the sample after QWI. As will be described in detail below, for the fabrication of SLDs with 50 μm active windows, a 1 μm resolution of OD increment from 0.15 to 1.05 was designed to produce "trapezoidal" and "triangular" profiles, (these are illustrated in FIG. 10).

The gray scale masks 10 are manufactured using a high-energy beam-sensitive (HEBS) glass article of the type described in detail in U.S. Pat. No. 5,078,771.

The relationship between the OD of the mask and the UV light transmittance level (T) during lithography process can be expressed using the following equation:

$$OD = -\log(T)$$

A reactive-ion etching (RIE) process with substantially a 1:1 selectivity between photoresist and SiO$_2$ was then used to transfer the variable thickness profile of the photoresist to the SiO$_2$ layer 12 to obtain an implantation mask 13. This process was carried out in a conventional parallel plates RF RIE system using CF$_4$ and O$_2$ as process gases. Taguchi's optimization approach, a statistical method used in industrial process optimization, was employed to optimise the parameters of this process.

Figure 6:
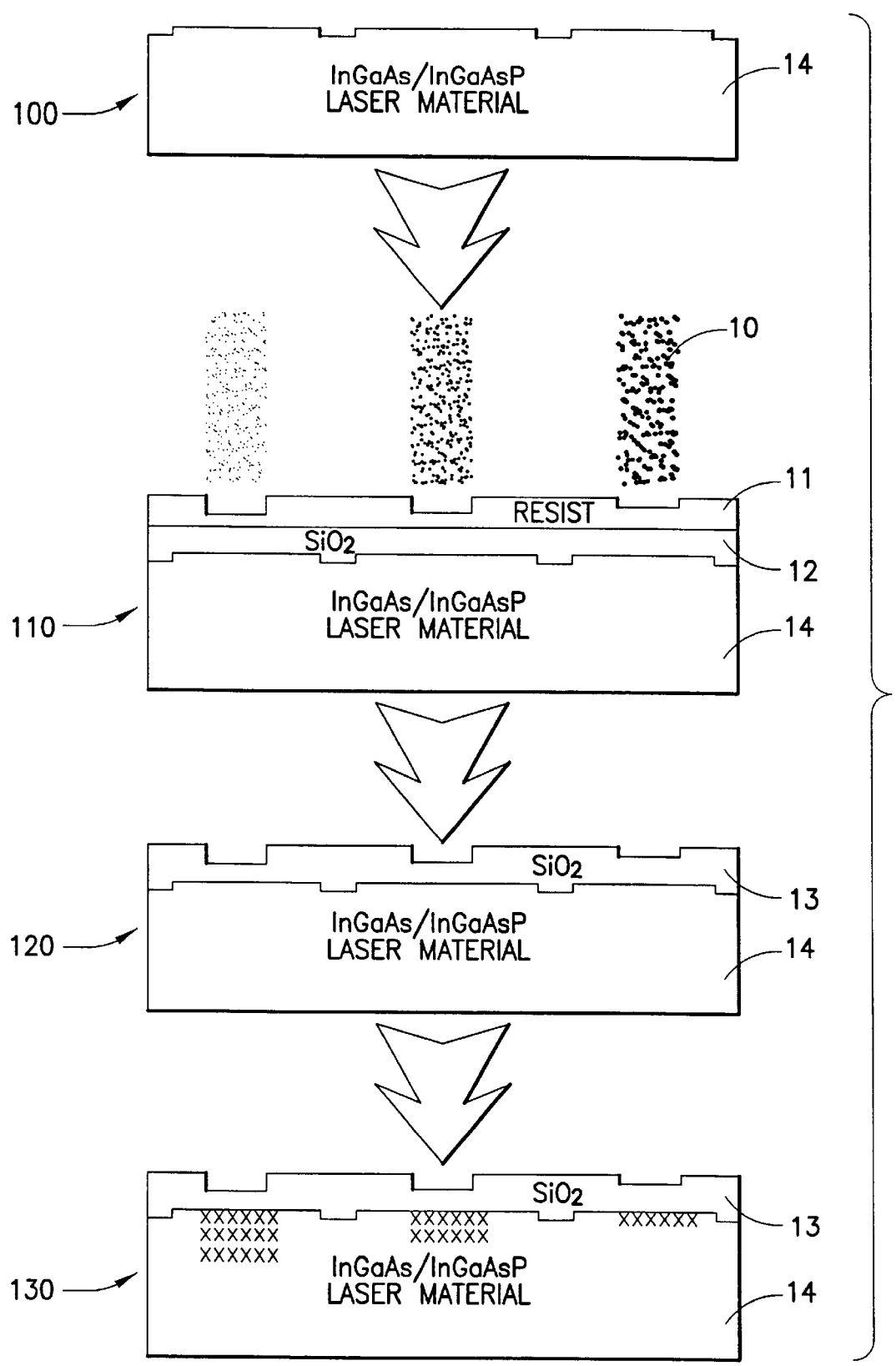
FIG. 6 is a flow diagram illustrating the fabrication of multiple wavelength lasers.

The process flow chart for the fabrication of the multiple wavelength lasers is shown in more detail in FIG. 6. A total of four levels of masks are used in the fabrication of this device. The first mask is used for alignment marks and laser isolation etching (a 20 μm stripe pattern). The second mask is a gray scale mask which has an 80 μm width of stripe pattern. The third mask is used for active contact window (a 50 μm stripe pattern) and the last mask is to define the metal isolation (a 20 μm stripe pattern).

Alignment marks and isolation stripes were first defined (step 100) by wet-etching, using H$_2$SO$_4$: H$_2$O$_2$: H$_2$O in 1:8:40 ratio, to remove 0.15 μm of the InGaAs and InGaAsP contact layers of the substrate 14. The sample was coated with SiO$_2$ 12 to a thickness of 0.95 μm after wet etching (step 110). Then, positive photoresist 11 was spin-coated at 3300 rpm for 35 seconds to a depth of 1.19 μm and a photolithography step was carried out to transfer the gray scale patterns 10 onto the sample. RIE was then performed (step 120) to transfer the graded photoresist pattern into the SiO$_2$ mask 12 such that different thickness of SiO2 were formed across the sample to create an implantation mask 13.

Figure 7:
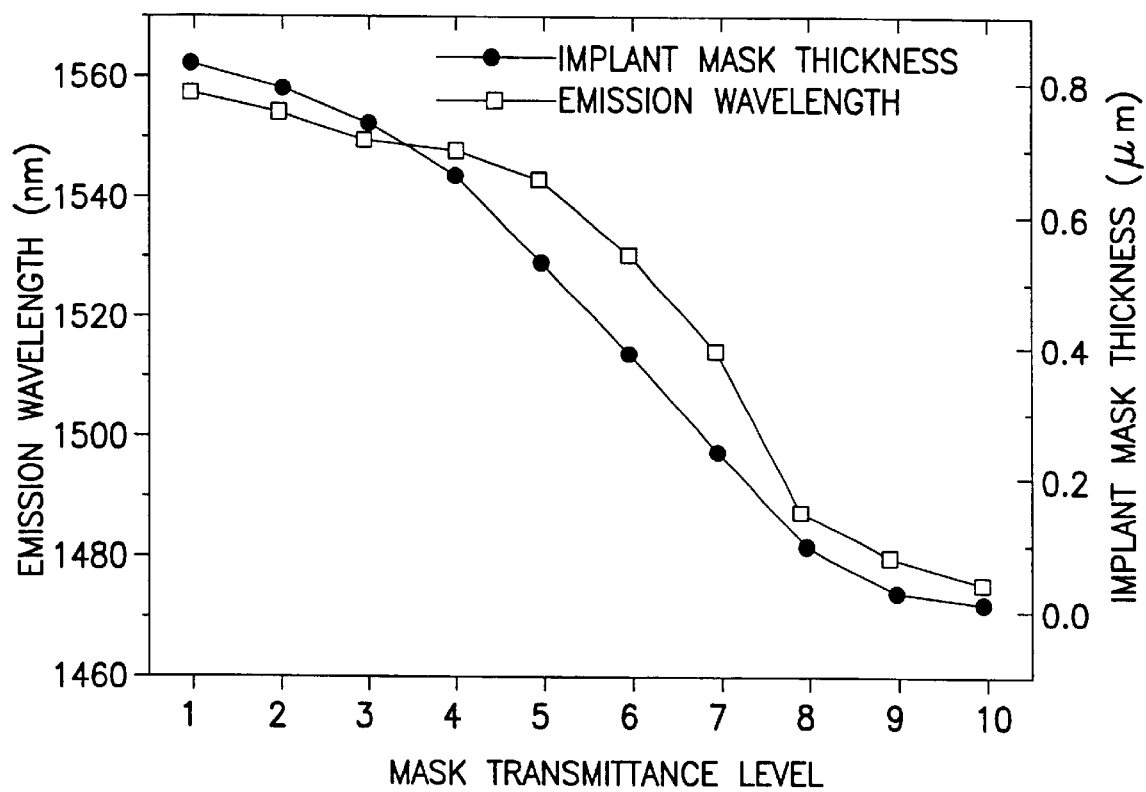
FIG. 7 is a graph showing the relationship between wavelength emission and mask transmittance level and implant mask thickness.

The thickness of the photoresist 11 and SiO$_2$ implantation mask 13, as measured from a surface profiler, both before and after RIE for the sample is given in FIG. 7.

After preparing the graded SiO$_2$ pattern, the sample was implanted (step 130) at 200° C. with a dose of $1 \times 10^4$ cm$^2$. The QWI step was then carried out using an RTP at 590° C. for 120 seconds with the SiO$_2$ implantation mask 13 intact. The Sio$_2$ implantation mask 13 was removed after QWI.

Figure 8:
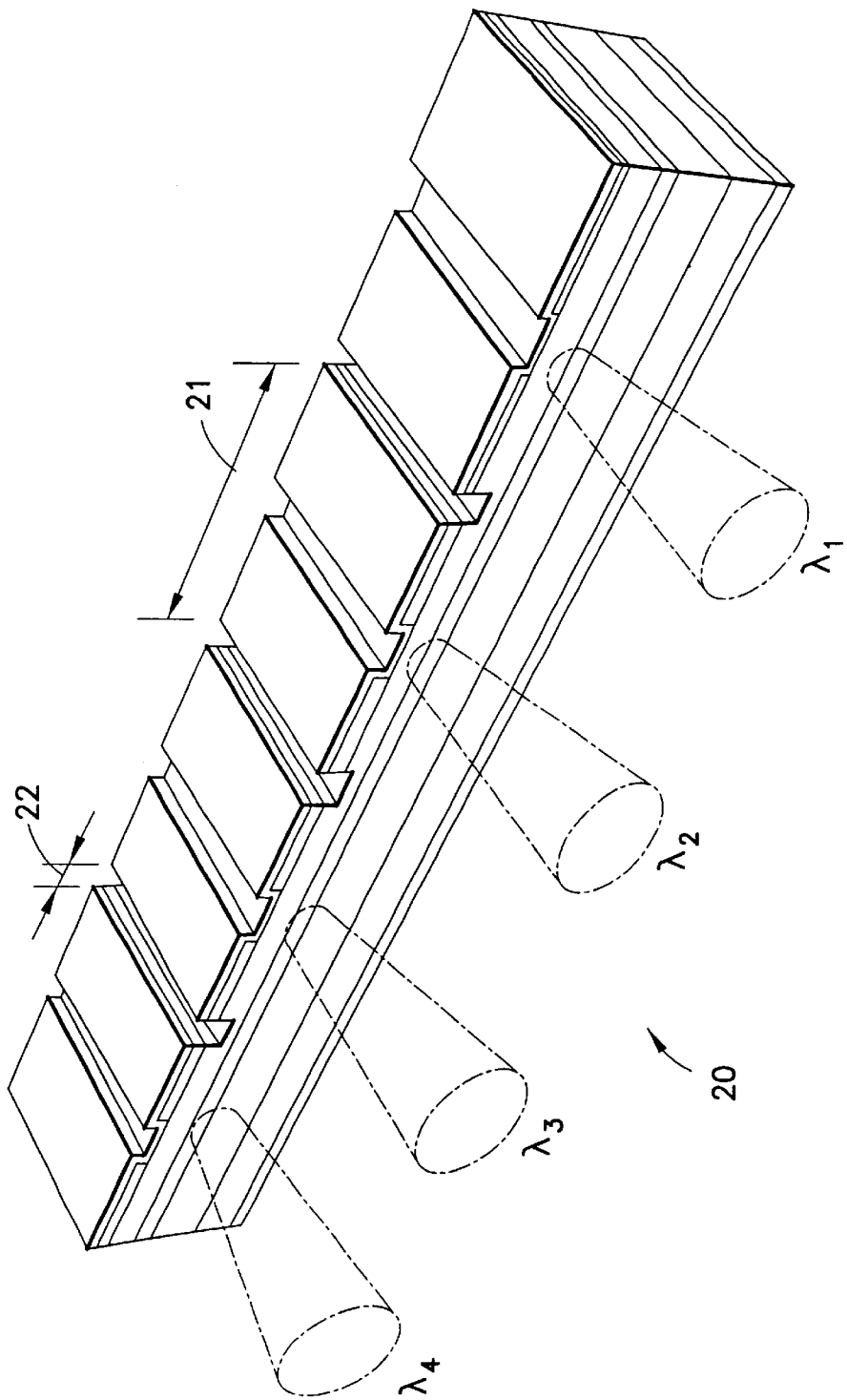
FIG. 8 is a schematic diagram of a monolithic multiple wavelength laser.

After fabrication, individual lasers were cleaved from the rows of multiple wavelength lasers for light intensity versus current and spectrum measurements. The schematic diagram of the monolithic multiple wavelength laser 20 is shown in FIG. 8 (only 4 channels are shown in the figure). In the example, a total of 10-channels monolithic multiple wavelength lasers were fabricated. Each individual laser 21 has a dimension of 400×500 μm and 50 μm width of active window, 500 μm cavity length and 20 μm width of isolation trench 22. Each laser 21 was pumped individually during the characterization and measurements.

Figure 9:
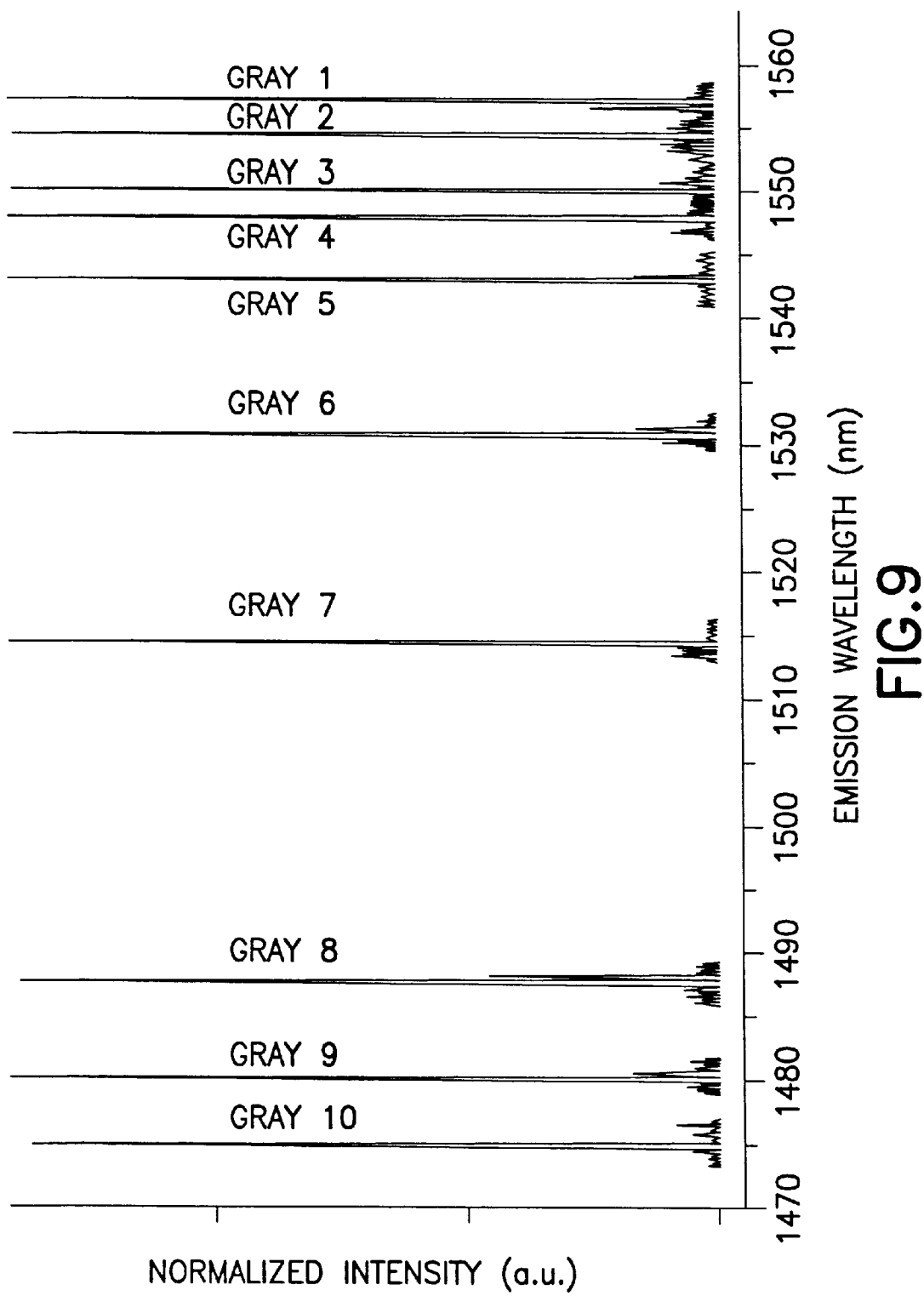
FIG. 9 is a graph illustrating the wavelength emissions of the devices of FIG. 8.

As shown in FIG. 9, 10 distinctive wavelengths of 1.557 μm, 1.555 μm, 1.550 μm, 1.548 μm, 1.543 μm, 1.530 μm, 1.514 μm, 1.487 μm, 1.479 μm and 1.474 μm, respectively, were detected from the 10 monolithic lasers 21 that were fabricated.

A linear correlation between thickness of the SiO$_2$ implantation mask 13 and the wavelength emission was found in FIG. 7. As a result, this phenomenon has further verified the linear relationship between the degree of point defects generated with different thickness of SiO$_2$ implantation mask and the degree of intermixing or bandgap-tuning.

A superluminescent diode (SLD) has the characteristics of high output power and low beam divergence, which are similar to the characteristics of an injection laser diode (LD). It gives a broad emission spectrum and low coherent length, which are similar to a LED. The applications of such device are not only limited to short and medium distance communication systems, but also a key element in the interferometric fiber-optic gyroscope (IFOG) system and other fiber-optic based sensing systems. SLD has the desirable characteristics such as the elimination of modal noise in fiber systems, immunity to optical feedback noise, and high coupling efficiency into fibers. As the spectral width

TABLE 1

| | Gray Level | | | | | | | | | |
|---|---|---|---|---|---|---|---|---|---|---|
| | 1 | 2 | 3 | 4 | 5 | 6 | 7 | 8 | 9 | 10 |
| OD | 0.15 | 0.25 | 0.35 | 0.45 | 0.55 | 0.65 | 0.75 | 0.85 | 0.95 | 1.05 |
| T (%) | 70.8 | 56.2 | 44.7 | 35.5 | 28.2 | 22.4 | 17.8 | 14.1 | 11.2 | 8.9 | broadens, the coherent length is reduced. The broadband characteristics of SLDs reduce Rayleigh backscattering noise, polarization noise and the bias offset due to the non-linear Kerr effect in fiber gyro systems. Therefore, SLD offers an advantage in obtaining the ultimate sensitivity in those applications.

In the following example, the same InGaAs/InGaAsP QW structures 14 were used in the fabrication of SLDs in which the bandgap in the SLD chip is tuned by utilizing "triangular" and "trapezoidal" gray scale patterns to achieve broadband luminescence from the SLD.

To obtain high output power from an SLD, one requires a very high optical gain within the device, consequently suppression of the lasing mode is a key concern. The suppression techniques can be divided into two categories. The first one is an active suppression method which consists of using umpumped absorber, short-circuited absorber and bending waveguide approaches. The second one is a passive suppression method which involves using non-absorbing window, angled-stripe and antireflection coating (AR) approaches. The combination of an active region with an unpumped absorbing region was applied in this example since this method has previously been successfully demonstrated to produce high performance SLDs.

The process flow for the fabrication of SLDs is shown in FIG. 10. A total of three levels of masks were used in this fabrication. The first mask is used for the definition of alignment marks. The second mask is the gray scale mask 10 to create triangular and trapezoidal profiles 30, 31 (see FIG. 6). The third mask is used to define the active contact window 41 and the absorber section 42 (a 50 $\mu$m stripe pattern for active section). The alignment marks were first defined by wet-etching the materials down to the third epitaxial layer, the InP-upper cladding, using chemical solutions. After the etching process, the sample was coated with $SiO_2$ 12 with a thickness of 0.95 $\mu$m, and a layer of photoresist 11 spun at 3300 rpm for 35 seconds to a depth of 1.18 $\mu$m. The structure was then exposed to UV through the gray scale mask 10 for a period of 5.1 seconds (steps 200).

After obtaining the exposed resist pattern, RIE (step 210) was then carried out to transfer the resist pattern into the $SiO_2$ to form an implantation mask 13.

After preparing the graded $SiO_2$ patterns 13, the samples were implanted (step 220) at 200° C. with a dose of $1 \times 10^{14}$ $cm^{-2}$ for P impurities. The QWI step was then carried out at 590° C. for 120 seconds with the $SiO_2$ implantation mask intact. After this, the $SiO_2$ implantation mask was removed.

Figure 11:
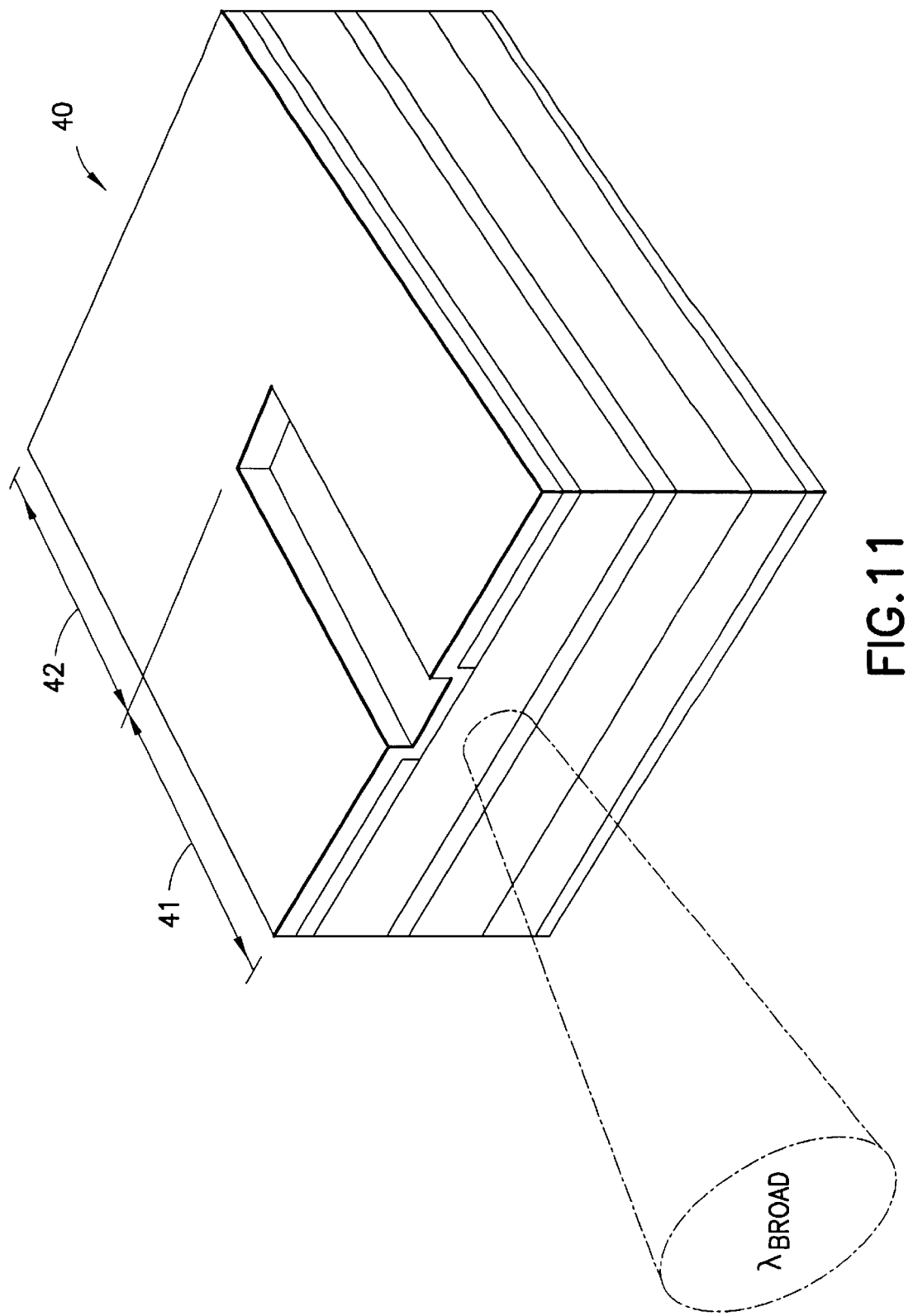
FIG. 11 is a schematic diagram of an SLD device.

A schematic diagram of a fabricated discrete SLD 40 is shown in FIG. 11. It is noted that the absorbing section region 42 which was not intermixed but annealed was unpumped with no metal contact on the surface. The SLD samples were then cleaved in order to assess their characteristics.

Figure 12:
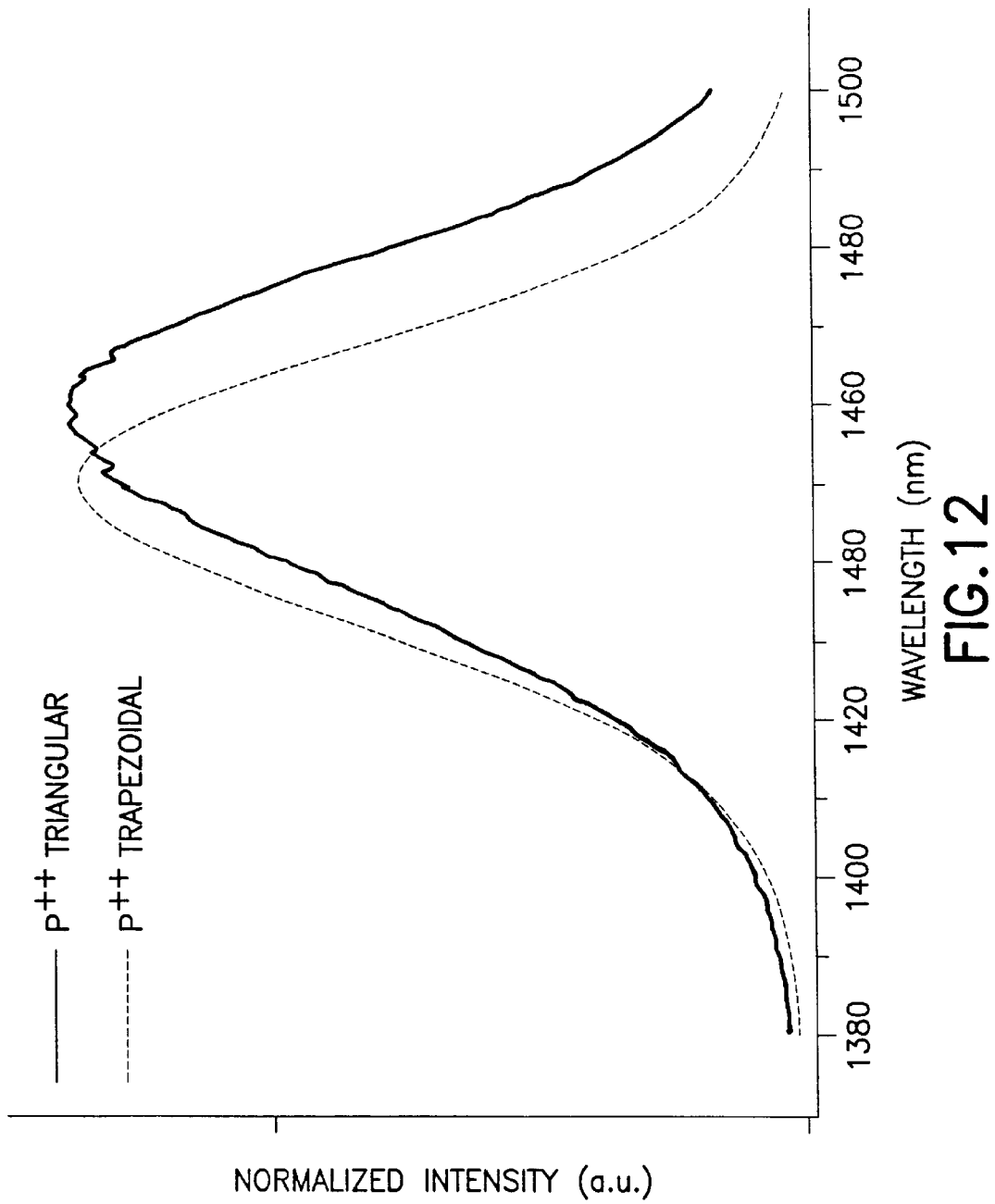
FIG. 12 is a graph showing the normalized spectra of SLD devices.

FIG. 12 shows the normalized emission spectra from the two types of SLDs fabricated under the same pumping current of 2.5 A. In general, the triangular-profiled SLD has a wider spectrum as compared to the trapezoidal-profiled SLD.

What is claimed is:

1. A method of manufacturing a photonic integrated circuit comprising a structure having a quantum well region, including the step of performing quantum well intermixing on the structure, wherein the step of performing quantum well intermixing comprises the steps of forming a photoresist on the structure and differentially exposing regions of the photoresist in a spatially selective manner in dependence on the degree of quantum well intermixing required, and subsequently developing the photoresist.

2. A method according to claim 1, comprising the step of applying an optical mask to the photoresist and exposing the photoresist through the optical mask, the optical mask having an optical transmittance that varies in a spatially selective manner.

3. A method according to claim 2, in which the optical transmittance varies according to a predetermined function.

4. A method according to claim 3, in which the optical transmittance is substantially continuously variable over at least a portion of the mask.

5. A method according to claim 2, in which the optical mask is a Gray scale mask.

6. A method according to claim 1, in which the photoresist is applied to a masking layer.

7. A method according to claim 6, in which the masking layer is a dielectric.

8. A method according to claim 6, further comprising the step of etching the structure with the developed photoresist in situ to provide a differentially etched masking layer.

9. A method according to claim 1, further comprising the step of introducing impurities into the structure in a single ion implantation step.

10. A method according to claim 9, in which the impurities are introduced through one of a focused ion beam, furnace-based impurity diffusion and ion implantation process.

11. A method according to claim 9, in which the impurities are implanted in a region remote from the quantum well structure.

12. A method according to claim 1, further comprising the step of exposing the structure to a plasma, thereby to introduce defects in the structure to promote subsequent quantum well intermixing.

13. A method according to claim 12, in which the plasma is generated by electron cyclotron resonance.

14. A method according to claim 1, further comprising the step of annealing the structure.

* * * * *